United States Patent [19]

Yamazaki

[11] 4,254,429

[45] Mar. 3, 1981

[54] HETERO JUNCTION SEMICONDUCTOR DEVICE

[76] Inventor: Shunpei Yamazaki, 21-21 Kitakarasuyama 7-chome, Setagaya-ku, Tokyo, Japan

[21] Appl. No.: 55,650

[22] Filed: Jul. 9, 1979

[30] Foreign Application Priority Data

Jul. 8, 1978 [JP] Japan .................................. 53-83467
Jul. 8, 1978 [JP] Japan .................................. 53-83468

[51] Int. Cl.³ ......................................... H01L 29/161
[52] U.S. Cl. ......................................... 357/16; 357/2; 357/59; 357/61; 357/4
[58] Field of Search ....................... 357/16, 2, 59, 61, 4

[56] References Cited

U.S. PATENT DOCUMENTS

| | | | |
|---|---|---|---|
| 3,564,353 | 2/1971 | Corak | 317/234 |
| 3,716,844 | 2/1973 | Brodsky | 340/173 LS |
| 3,821,773 | 6/1974 | Mize | 357/61 |
| 4,016,586 | 5/1977 | Merrin | 357/2 |
| 4,024,558 | 5/1977 | Merrin | 357/2 |

Primary Examiner—Martin H. Edlow
Attorney, Agent, or Firm—Gerald J. Ferguson, Jr.; Joseph J. Baker

[57] ABSTRACT

A hetero junction semiconductor device having at least one inter-semiconductor hetero junction, which has at least a first non-single-crystal semiconductor region having a first energy gap, a second non-single-crystal semiconductor region having a second energy gap different from the first energy gap and a third non-single-crystal semiconductor region serving as the hetero junction formed to extend between the first and second semiconductor regions and having an energy gap continuously changing from the first energy gap on the side of the first semiconductor region to the second energy gap on the side of the second semiconductor region, and in which the first, second and third semiconductor regions are doped with recombination center neutralizers.

7 Claims, 17 Drawing Figures

HETERO JUNCTION SEMICONDUCTOR DEVICE

BACKGROUND OF THE INVENTION

1. Field of the Invention

This invention relates to a hetero junction semi-conductor device which has at least one inter-semiconductor hetero junction.

2. Description of the Prior Art.

Heretofore, there have been proposed a variety of hetero junction semiconductor devices which have at least one inter-semiconductor hetero junction. Typical hetero junction semiconductor devices are as follows: a p-n or n-p type photo diode having one p-n hetero junction, an iso-type (n-n or p-p type) photo diode having one n-n or p-p hetero junction, a p-n-p or n-p-n type photo transistor having two p-n hetero junctions, a p-i-n or n-i-p type photo diode having one p-i hetero junction and one n-i hetero junction, an n-p-n-p or p-n-p-n type photo cell having three p-n hetero junctions, a p-i-i-n or n-i-i-p type photo cell having one p-i hetero junction, one i-i hetero junction and one n-i hetero junction, etc.

These hetero junction semiconductor devices are of the type that make effective use of a difference in height between a barrier against electrons injected from one of two semiconductor regions into the other across the hetero junction defined there between and a barrier against holes injected from the latter to the former.

The conventional hetero junction semiconductor devices are all made of a single crystal semiconductor, so that each hetero junction is formed abruptly between two single-crystal semiconductor regions having different energy gaps. And, since there is a difference in lattice constant between the two single-crystal semiconductor regions, dangling bonds are formed locally at the position of each hetero junction, and accordingly interface states or defects are present locally at the position of each hetero junction, resulting in an energy and band structure that has, at the position of each hetero junction, an energy spike or notch extending towards either one of a valence band and a conduction band.

Accordingly, in the prior art hetero junction semiconductor devices, during operation electrons or holes to be injected from one of the two semeconductor regions into the other across the hetero junction are partly absorbed by the interface states or defects appearing at the position of the hetero junction, and migration of electrons or holes from one of the two semiconductor regions to the other across the hetero junction is similarly limited by the energy spike or notch at the position of the hetero junction; therefore, the conventional hetero junction semiconductor devices have the defect that they cannot operate on large currents.

SUMMARY OF THE INVENTION

Accordingly, the present invention has for its object to provide a novel hetero junction semiconductor device which is free from the abovesaid defect of the prior art.

In accordance with this invention, a hetero junction semiconductor device is formed of a non-single-crystal-semiconductor doped with recombination center neutralizers, so that each hetero junction having no dangling bonds is formed between two non-single-crystal semiconductor regions having different first and second energy gaps and having no dangling bonds; furthermore the hetero junction has an energy gap continuously changing from the first energy gap on the side of one of the two non-single-crystal semiconductor regions to the second energy gap on the side of the other; therefore, in terms of the energy band structure, the hetero junction semiconductor device of this invention does not have, at the position of each hetero junction, any energy spike or notch extending towards either one of the valence band and the conduction band nor does it have any interface states or defects. Accordingly, the hetero junction semiconductor device of this invention can be operated on large currents.

DESCRIPTION OF THE PREFERRED EMBODIMENTS

A description will be given first of an example of one n-p type photo diode of this invention which has one p-n hetero junction.

Figure 1:
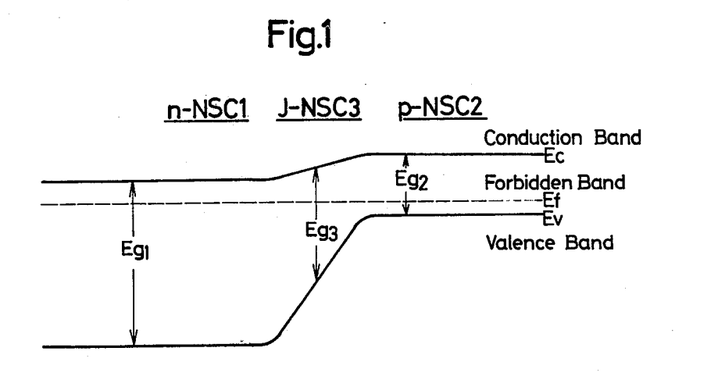
FIGS. 1, 2 and 3 show, in terms of energy band structure, examples of a n-p type photo diode having one p-n hetero junction according to this invention.

FIG. 1 illustrates, in terms of energy band structure, the abovesaid example of this invention. The energy band structure in FIG. 1 and FIGS. 2 to 17, referred to later, are shown to be in thermal balance states. In FIGS. 1 to 17, inclusive, reference characters $E_f$, $E_c$ and $E_v$ indicate the Fermi level, the bottom level of the conduction band and the top level of the valence band, respectively.

The n-p type photo diode of this invention comprises an n-type non-single-crystal semiconductor region n-

NSC1 having an energy gap $E_{g1}$, a p-type non-single-crystal semiconductor region p-NSC2 having an energy gap $E_{g2}$ smaller than that $E_{g1}$ of the semiconductor region n-NSC1 and a non-single-crystal semiconductor region J-NSC3 serving as a hetero junction which is formed to extend between the semiconductor regions n-NSC1 and p-NSC2. In this case, the semiconductor region J-NSC3 forms a transition region in which the n-type conductivity type on the side of the semiconductor region n-NSC1 is changed to the p-type conductivity type on the side of the semiconductor region p-NSC2 and which has an energy gap $E_{g3}$ continuously decreasing from the energy gap $E_{g1}$ on the side of the semiconductor region n-NSC1 towards the energy gap $E_{g2}$ on the side of the semiconductor region p-NSC2. And the semiconductor regions n-NSC2 and J-NSC3 have doped therein a recombination center neutralizer, such as hydrogen, deutrium, fluorine, chlorine, bromine or halogenide, at a concentration of 0.1 to 200 mol%.

In the manufacture of such a semiconductor structure, a silicide gas (such as silane, dichlorosilane, silicon tetrachloride, or silicon tetrafluoride gas), a carbonide gas (such as methane gas) or nitride gas (such as ammonium gas) or oxygen or oxide gas, a p-type impurity material gas (such as diborane gas), a n-type impurity material gas (such as phosphine (PH$_3$) or arsine (AsH$_3$) gas) and a carrier gas (such as hydrogen or hydrogen chloride gas) also serving as a recombination center neutralizer gas are individually adjusted in quantity in accordance with a predetermined program and introduced into a reaction furnace in which is placed a proper substrate on which the semiconductor regions are to be deposited in layers. In the reaction furnace, by the so-called low pressure chemical vapor deposition method or glow discharge method, the semiconductor region n-NSC1 is formed, for example, of non-single crystal of $Si_xC_{1-x}$ $(0.5<x<1)$, $Si_3N_{4-x}$ $(0<x<4)$ or $SiO_{2-x}$ $(0<x<2)$, the semiconductor region p-NSC2 is formed, for example, of non-single crystal of Si and the semiconductor region J-NSC3 is formed, for example, of non-single crystal of $Si_yC_{1-y}$, $Si_3N_{4-y}$ or $SiO_{2-y}$ (where the value of y is larger than that of x and continuously changes from the value of x on the side of the semiconductor region n-NSC1 to a value 1). In this case, by heating the substrate together with the atmosphere in the reaction furnace by high-frequency induction or by the combined use of high-frequency induction and radiation, the recombination center neutralizers are doped in the semiconductor regions n-NSC1, p-NSC2 and J-NSC3. Further, the semiconductor regions n-NSC1, p-NSC2 and J-NSC3 are provided in amorphous and polycrystalline form when the substrate temperature ranges from room temperature to 500° C. and 350° C. to 900° C., respectively.

The above is one example of the n-p photo diode of this invention which has one p-n hetero junction. With such an arrangement, there is formed in its energy band structure the hetero junction J-NSC3 which extends between the semiconductor regions n-NSC1 and p-NSC2 and whose energy gap $E_{g3}$ continuously changes from the energy gap $E_{g1}$ on the side of the semiconductor region n-NSC1 to the energy gap $E_{g2}$ on the side of the semiconductor region p-NSC2, but there is not formed at the position of the hetero junction any energy spike or notch extending towards either one of the valence band and the conduction band nor interface states or defects are formed.

Figure 15:
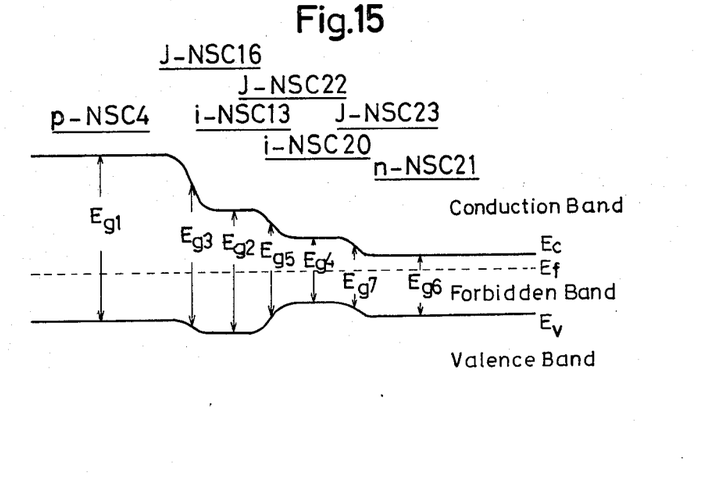
FIG. 15 shows, in terms of energy band structure, an example of a p-i-i-n type photo cell having one p-i hetero junction, one i-i hetero junction and one n-i hetero junction according to this invention.
Figure 16:
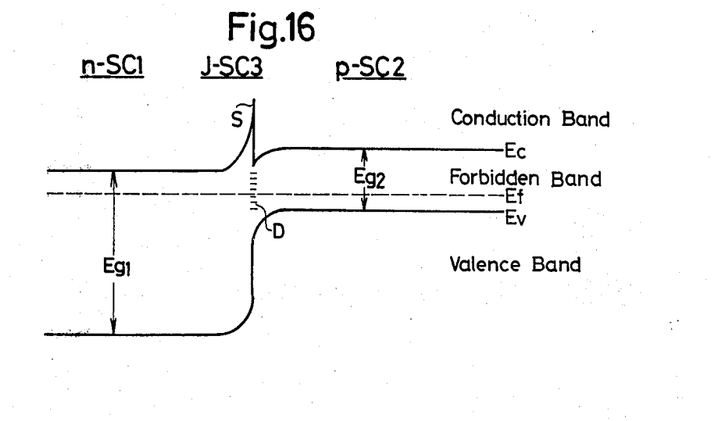
FIG. 16 shows, in terms of energy band structure, a conventional n-p type photo diode having one p-n hetero junction.

Incidentally, if a p-n type photo diode corresponding to the abovesaid n-p type photo diode of this invention which has one p-n hetero junction is made of a single-crystal semiconductor, then it will have such an energy band structure as shown in FIG. 15 which comprises an n-type single-crystal semiconductor region n-SC1 having an energy gap $E_{g1}$, a p-type single-crystal semiconductor region p-SC2 having an energy gap $E_{g2}$ and a single-crystal semiconductor region J-SC3 serving as a hetero junction which extends between the n-type and p-type semiconductor regions n-SC1 and p-SC2 and forms a transition region in which the n-type conductivity type on the side of the semiconductor region n-SC1 is changed to the p-type conductivity type on the side of the semiconductor region p-SC2. In this case, there are formed at the position of the hetero junction interface states or defects, as indicated by D, and an energy spike extending towards the conduction band as indicated by S; however, the present invention does not permit the formation of such interface states or defects D and energy spike S.

Further, in the present invention, the recombination center neutralizers doped in the semiconductor regions n-NSC1, p-NSC2 and J-NSC3 are bonded with dangling bonds which are distributed at low density in the semiconductor regions n-NSC1, p-NSC2 and J-NSC3 unless such nertralizers are doped therein, and as a consequence, substantially no such dangling bonds are present in the semiconductor regions.

Accordingly, the hetero junction semiconductor device having one hetero junction according to this invention is capable of operating on large currents.

With the abovesaid n-p hetero junction photo diode of this invention, in the case where the semiconductor region n-NSC1 is formed of non-single crystal of $Si_xC_{1-x}$ $(0.5<x<1)$ whose energy band $E_{g1}$ has 2.0 to 3.0 eV and which is doped with 20 to 40 mol% of hydrogen (H) used as the recombination center neutralizer, the semiconductor region p-NSC2 is formed of non-single crystal of Si whose energy gap $E_{g2}$ has 1.0 to 1.5 eV and which is doped with 3 to 10 mol% of H used as the recombination center neutralizer and the semiconductor region J-NSC3 is formed of non-single crystal of $Si_yC_{1-y}$ (where the value of y is larger than that of x and continuously changes from the value of x on the side of the semiconductor region n-NSC1 to a value 1) which is doped with 5 to 30 mol% of H used as the recombination center neutralizer, the photoelectric conversion efficiency of the photo diode is as high as 8 to 13%.

Figure 2:
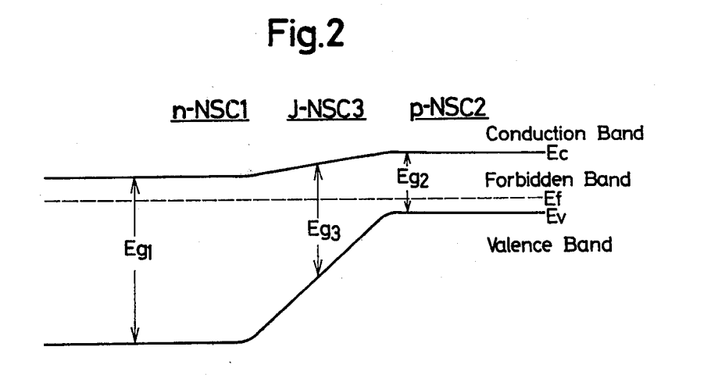
Figure 3:
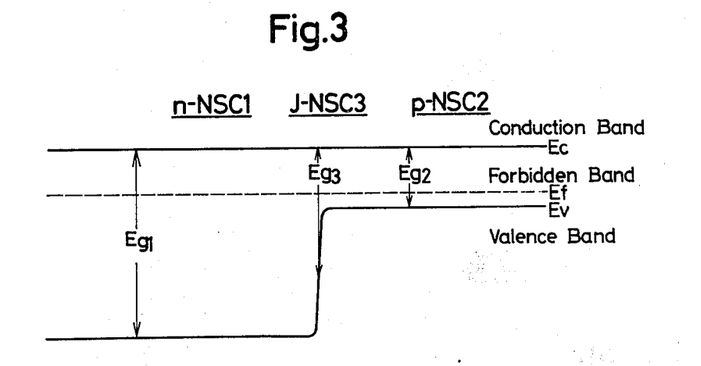

FIGS. 2 and 3 illustrate, in respect of energy band structure, another example of the n-p type photo diode having one p-n hetero junction. In FIGS. 2 and 3, parts corresponding to those in FIG. 1 are identified by the same reference characters and no detailed description will be repeated. The example of FIG. 2 is identical in construction with the example of FIG. 1 except in that the width of the non-single-crystal semiconductor region J-NSC3 is smaller than in the latter case, and has the same feature as described previously with respect to FIG. 1. The example of FIG. 3 is also identical with the example of FIG. 1 except in that the width of the non-single-crystal semiconductor region J-NSC3 is smaller than in the latter case and in that the non-single-crystal semiconductor regions n-NSC1, p-NSC2 and J-NSC3 have their bottom levels of the conduction band at the same energy level. Also the example of FIG. 3 exhibits the same advantage as mentioned previously in connection with FIG. 1.

Figure 4:
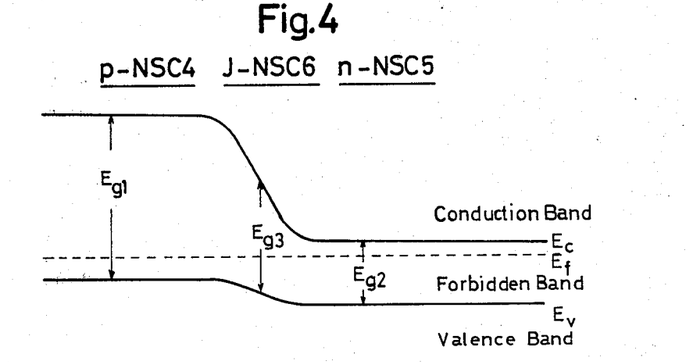
FIG. 4 shows, in terms of energy band structure, an example of a p-n type photo diode having one p-n hetero junction according to this invention.

FIG. 4 shows, in conjunction with energy band structure, an example of a p-n type photo diode having one p-n hetero junction. This photo diode comprises a p-type non-single-crystal semiconductor region p-NSC4 having an energy gap $E_{g1}$, an n-type non-single-crystal semiconductor region n-NSC5 having an energy gap $E_{g2}$ and a non-single-crystal semiconductor region J-NSC6 which extends between the semiconductor regions p-NSC4 and n-NSC5 and serves as a p-n hetero junction. The semiconductor region J-NSC6 constitute a transition region in which the p-type conductivity type on the side of the semiconductor region p-NSC4 is changed to the n-type conductivity type on the side of the semiconductor region n-NSC5, and this semiconductor region J-NSC6 has an energy gap $E_{g3}$ which continuously decreases from the energy gap $E_{g1}$ on the side of the semiconductor region p-NSC4 towards the energy gap $E_{g2}$ on the side of the semiconductor region n-NSC5. It will be seen that the photo diode of the present example also has the same feature as is the case with the example of FIG. 1.

Figure 5:
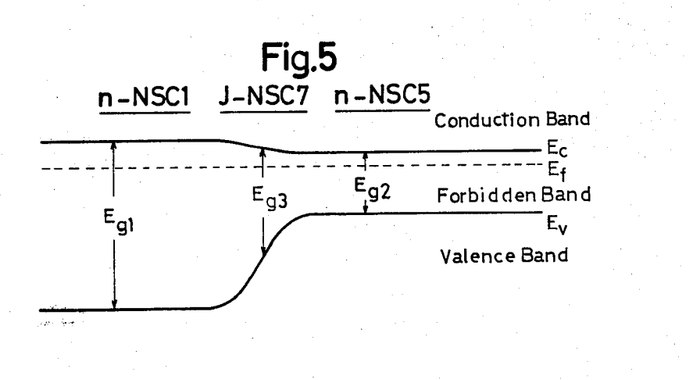
FIG. 5 shows, in terms of energy band structure, an example of an iso-type photo diode having one n-n hetero junction according to this invention.
Figure 17:
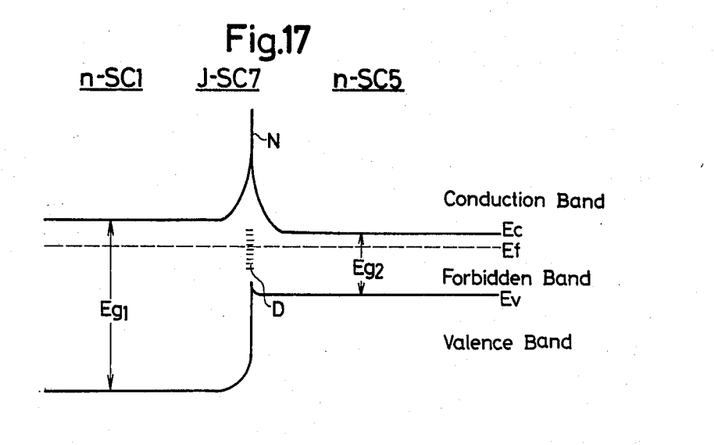
FIG. 17 shows, in terms of energy band structure, a conventional iso-type photo diode having one n-n hetero junction.

FIG. 5 illustrates an example of an iso-type photo diode having one n-n hetero junction. This photo diode comprises an n-type non-single-crystal semiconductor region n-NSC1 having an energy gap $E_{g1}$, an n-type non-single-crystal semiconductor region n-NSC5 having an energy gap $E_{g2}$ and a non-single-crystal semiconductor region J-NSC7 which extends between the semiconductor regions n-NSC1 and n-NSC5 and functions as an n-n hetero junction, and this semiconductor region J-NSC7 has an energy gap $E_{g3}$ which continuously diminishes towards the energy gap $E_{g2}$ on the side of the semiconductor region n-NSC5 from the energy gap $E_{g1}$ on the side of the semiconductor region n-NSC1. The iso-type photo diode of this example also has the same feature as is the case with FIG. 1. Incidentally, where an iso-type photo diode having one n-n hetero junction, which corresponds to the iso-type photo diode of this invention shown in FIG. 5, is formed of a single-crystal semiconductor, such a structure as depicted in FIG. 17 is resulted which comprises an n-type single-crystal semiconductor region n-SC1 having an energy gap $E_{g1}$, an n-type single-crystal semiconductor region n-SC5 having an energy gap $E_{g2}$ and a single crystal semiconductor region n-SC7 which extends between the semiconductor regions n-SC1 and n-SC5 and acts as an n-n hetero junction. In this instance, the interface states or defects D and the energy notch N are formed at the position of the n-n hetero junction; accordingly, the iso-type photo diode of FIG. 17, which is not based on the present invention, is incapable of operating on large currents. In the iso-type photo diode of this invention, however, the abovesaid interface states or defects D and the energy notch N are not provided, so that this photo diode can operate on large currents.

Figure 6:
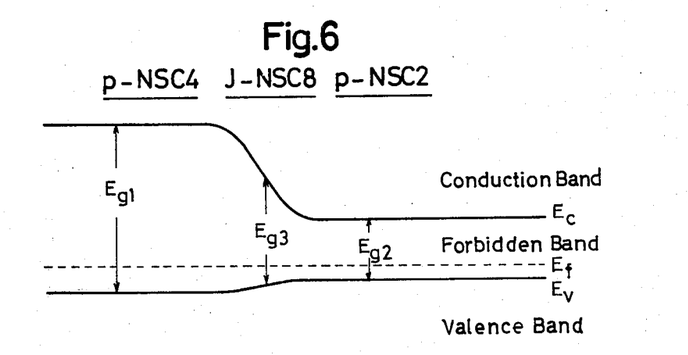
FIG. 6 shows, in terms of energy band structure, an example of an iso-type photo diode having one p-p hetero junction according to this invention.

FIG. 6 shows an example of an iso-type photo diode having one p-p hetero junction, according to this invention, which comprises a p-type non-single-crystal semiconductor region p-NSC4 having an energy gap $E_{g1}$, a p-type non-single-crystal semiconductor region p-NSC2 having an energy gap $E_{g2}$ and a non-single-crystal semiconductor region J-NSC8 which extends between the semiconductor regions p-NSC4 and p-NSC2 and serves as a p-p hetero junction, and this semiconductor region J-NSC8 has an energy gap $E_{g3}$ which successively diminishes towards the energy gap $E_{g2}$ on the side of the semiconductor region p-NSC2 from the energy gap $E_{g1}$ on the side of the semiconductor region p-NSC4. This iso-type photo diode also has the same feature as the example of FIG. 5.

Figure 7:
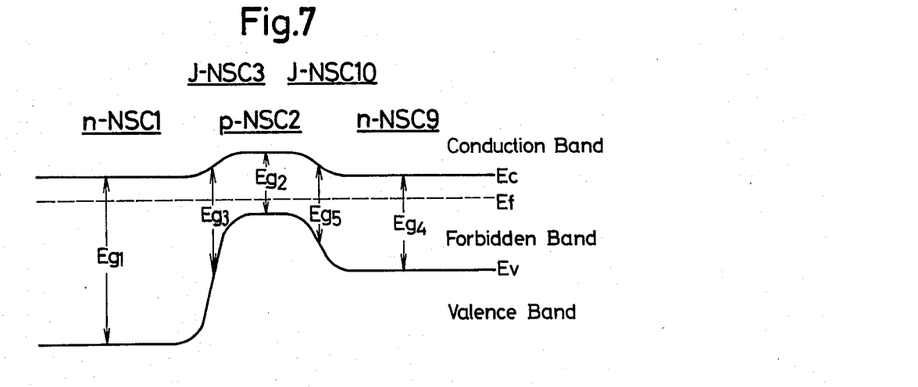
FIGS. 7 and 8 show, in terms of energy band structure, examples of a n-p-n type photo transistor having two p-n hetero junctions according to this invention.

FIG. 7 liilustrates an example of an n-p-n type photo transistor having two p-n hetero junctions according to this invention. This photo transistor comprises, in addition to the non-single-crystal semiconductor regions n-NSC1, J-NSC3 and n-NSC2 of the structure of FIG. 1, an n-type non-single-crystal semiconductor region n-NSC9 having an energy gap $E_{g4}$ larger than that $E_{g2}$ and a non-single-crystal semiconductor region J-NSC10 which extends between the semiconductor regions p-NSC2 and n-NSC9 and functions as a p-n hetero junction. The semiconductor region J-NSC10 forms a transition region in which the p-type conductivity type on the side of the semiconductor region p-NSC2 is changed to the n-type conductivity type on the side of the semiconductor region n-NSC9, and has an energy gap $E_{g5}$ which continuously increases towards the energy gap $E_{g4}$ on the side of the semiconductor region n-NSC9 from the energy gap $E_{g2}$ on the side of the semiconductor region p-NSC2.

With such an arrangement of FIG. 7, the photo transistor has the semiconductor regions J-NSC3 and J-NSC10 as p-n hetero junctions, and the one semiconductor region J-NSC3 has the structure described previously in respect of FIG. 1 and the other semiconductor region J-NSC10 has a structure similar to the region J-NSC3, so that this photo transistor exhibits as high a photoelectric conversion efficiency as 15 to 30%, although no detailed description will be given.

Figure 8:
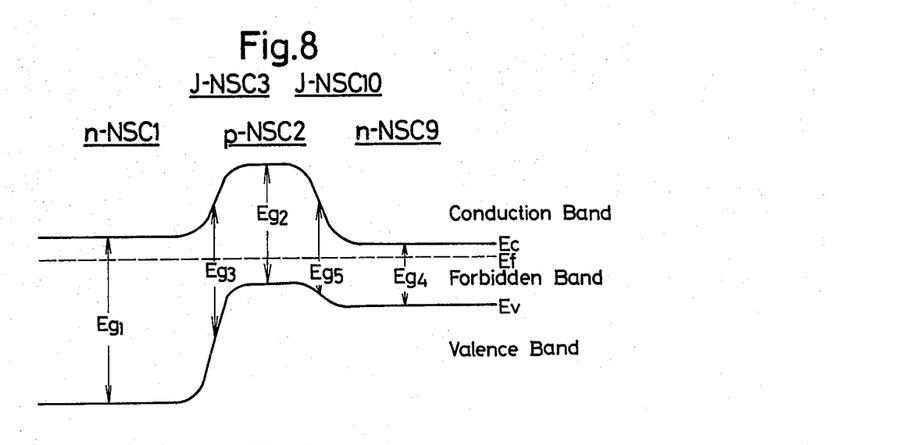

FIG. 8 shows another example of the n-p-n type photo transistor of this invention which has two p-n hetero junctions as in the case of FIG. 7. In FIG. 8, parts corresponding to those in FIG. 7 are indicated by the same reference characters, and no detailed description will be given of them. This example is identical in construction with the example of FIG. 7 except in that the energy gap $E_{g4}$ of the semiconductor region n-NCS9 is smaller than that $E_{g2}$ of the semiconductor region p-NSC2, and has the same feature as the example of FIG. 7.

Figure 9:
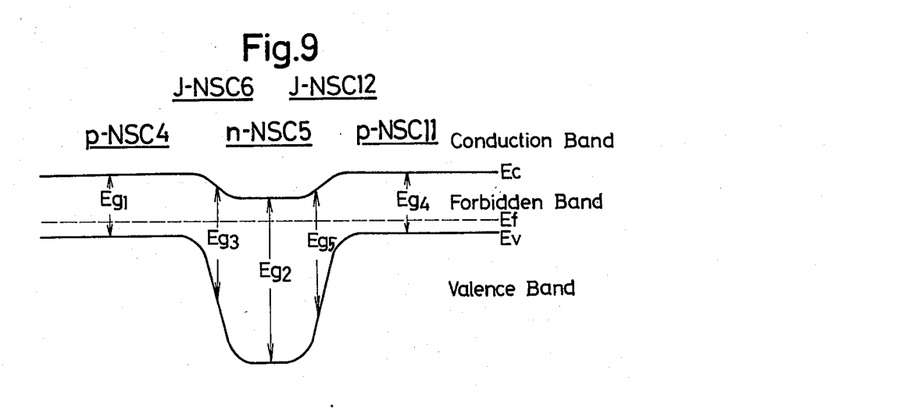
FIGS. 9 and 10 show, in terms of energy band structure, examples of a p-n-p type photo transistor having two p-n hetero junctions according to this invention.

FIG. 9 illustrates an example of a p-n-p type photo transistor having two-p-n hetero junctions according to this invention. This photo transistor comprises in addition to the non-single-crystal semiconductor regions p-NSC4, J-NSC6 and n-NSC6 of the abovesaid structure of FIG. 4, a p-type non-single-crystal semiconductor region p-NSC11 having an energy gap $E_{g4}$ smaller than the energy gap $E_{g2}$ and a non-single-crystal semiconductor region J-NSC12 which is defined between the semiconductor regions n-NSC5 and p-NSC11 and acts as a p-n hetero junction. The semiconductor region J-NSC12 forms a transition region in which the n-type conductivity type on the side of the semiconductor region n-NSC5 is changed to the p-type conductivity type on the side of the semiconductor region p-NSC11, and has an energy gap $E_{g5}$ which successively diminishes towards the energy gap $E_{g4}$ on the side of the semiconductor region n-NSC11 from the energy gap $E_{g2}$ on the side of the semiconductor region n-NSC5. In this case, however, the energy gap $E_{g4}$ of the semiconductor region n-NSC11 is larger than that $E_{g4}$ of the semiconductor region n-NSC5.

With such a construction of FIG. 9, the semiconductor regions J-NSC6 and J-NSC12 are provided as p-n hetero junctions, and the one semiconductor region J-NSC6 has the structure described previously in connection with FIG. 4 and the other semiconductor region J-NSC12 has a structure similar to that of the semiconductor region J-NSC6. Accordingly, although no detailed description will be made, high photoelectric conversion efficiency of the photo transistor can be obtained as is the case with FIG. 8.

Figure 10:
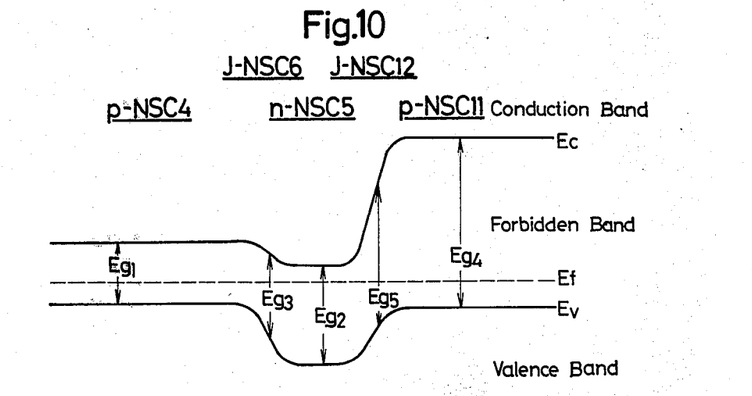

FIG. 10 shows another example of the p-n-p type photo transistor, which has two p-n hetero junctions as in the case of FIG. 9. In FIG. 10, parts corresponding to those in FIG. 9 are marked with the same reference characters, and no detailed description will be repeated, and this photo this transistor is identical in construction with the example of FIG. 9 except in that the energy gap $E_{g4}$ of the semiconductor region p-NSC11 is larger than that $E_{g2}$ of the semiconductor region n-NSC5, and the same feature as in the case of FIG. 9 can be obtained.

Figure 11:
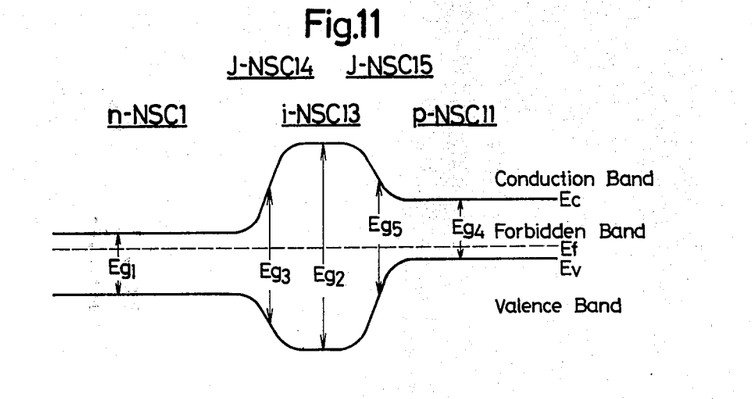
FIG. 11 shows, in terms of energy band structure, an example of an n-i-p type photo diode having one n-i hetero junction and one p-i hetero junction according to this invention.

FIG. 11 illustrates an example of an n-i-p type photo diode of this invention which has one n-i hetero junction and one p-i hetero junction, and which comprises a n-type non-single-crystal semiconductor region n-NSC1 having an energy gap $E_{g1}$, an i-type (intrinsic) non-single-crystal semiconductor region i-NSC13 having an energy gap $E_{g2}$ larger than that $E_{g1}$, a non-single-crystal semiconductor region J-NSC14 defined between the semiconductor regions N-NSC1 and i-NSC13 and functioning as an n-i hetero junction, a p-type non-single-crystal semi-conductor region p-NSC11 having an energy gap $E_{g4}$ smaller than that $E_{g2}$ and a non-single-crystal semiconductor region J-NSC15 defined between the semiconductor regions i-NSC13 and p-NSC11 and serving as a p-i hetero junction. The semiconductor region n-NSC14 has an energy gap $E_{g3}$ which continuously increases towards the energy gap $E_{g2}$ on the side of the semiconductor region i-NSC13 from the energy gap $E_{g1}$ on the side of the semiconductor region n-NSC1, and the semiconductor region J-NSC15 has an energy gap $E_{g5}$ which continuously diminishes towards the energy gap $E_{g4}$ on the side of the semiconductor region p-NSC11 from the energy gap $E_{g2}$ on the side of the semiconductor region i-NSC13.

The example of FIG. 11, though not described in detail, provides the function of the photo diode which operates on large currents.

Figure 12:
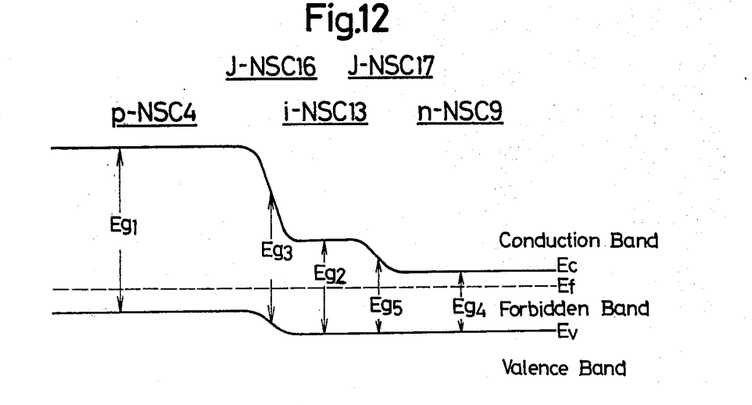
FIG. 12 shows, in terms of energy band, an example of a p-i-n type photo diode having one p-i hetero junction and one n-i hetero junction according to this invention.

FIG. 12 illustrates an example of a p-i-n type photo diode of this invention which has one p-i hetero junction and one n-i hetero junction, and which comprises a p-type non-single-crystal semiconductor region p-NSC4 having an energy gap $E_{g1}$, a non-single-crystal semiconductor region i-NSC13 having an energy gap $E_{g2}$ smaller than that $E_{g1}$, a non-single-crystal semiconductor region n-NSC9 having an energy gap $E_{g4}$ smaller than that $E_{g2}$ and i-type non-single-crystal semiconductor regions J-NSC16 and J-NSC17 which are respectively defined between the semiconductor regions p-NSC4 and i-NSC13 and between the semiconductor regions i-NSC13 and n-NSC9. The semiconductor region J-NSC16 has an energy gap $E_{g3}$ which successively diminishes towards the energy gap $E_{g2}$ on the side of the semiconductor region i-NSC13 from the energy gap $E_{g1}$ on the side of the semiconductor region p-NSC4, and the semiconductor region J-NSC17 has an energy gap $E_{g5}$ which successively diminishes towards the energy gap $E_{g4}$ on the side of the semiconductor region n-NSC9 from the energy gap $E_{g2}$ on the side of the semiconductor region i-NSC13. The example of FIG. 12, though not described in detail, also achieves the function of the photo diode which peforms an operation similar to that in the case of FIG. 11.

Figure 13:
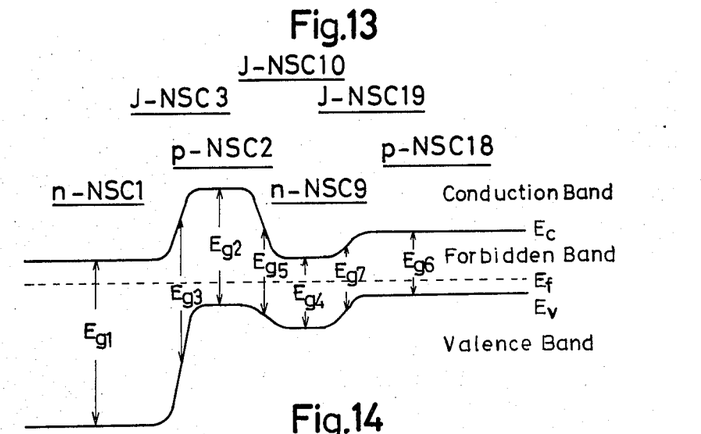
FIGS. 13 and 14 show, in terms of energy band structure, examples of an n-p-n-p type phot cell having three p-n hetero junctions according to this invention.

FIG. 13 shows an example of a n-p-n-p type photo cell of this invention which has three p-n hetero junctions, and which comprises, in addition to the semiconductor regions n-NSC1, J-NSC3, p-NSC2, J-NSC10 and n-NSC9 of the aforesaid structure of FIG. 8, a p-type non-single-crystal semiconductor region p-NSC18 having an energy gap $E_{g6}$ smaller than that $E_{g4}$ and a non-single-crystal semiconductor region J-NSC19 which is defined between the semiconductor regions n-NSC9 and p-NSC18 and serves as a p-n hetero junction. The semiconductor region J-NSC19 forms a transition region in which the n-type conduction type on the side of the semiconductor region n-NSC9 is changed to the n-type conductivity type on the side of the semiconductor region p-NSC18, and has an energy gap $E_{g7}$ which successively diminishes towards the energy band $E_{g6}$ on the side of the semiconductor region p-NSC18 from the energy band $E_{g4}$ on the side of the semiconductor region n-NSC9.

In accordance with such a structure as shown in FIG. 13, the photo cell has the semiconductor regions J-NSC3, J-NSC10 and J-NSC19 as p-n hetero junctions, and the semiconductor regions J-NSC10 and J-NSC19 respectively have the structures described previously in connection with FIG. 8, and the semiconductor region J-NSC19 has the same structure as the semiconductor region J-NSC10. Accordingly, the n-p-n-p type photo cell of this example, though not described in detail, exhibits as high photoelectric conversion efficiency as 25 to 30% when put to use under high temperature conditions.

Figure 14:
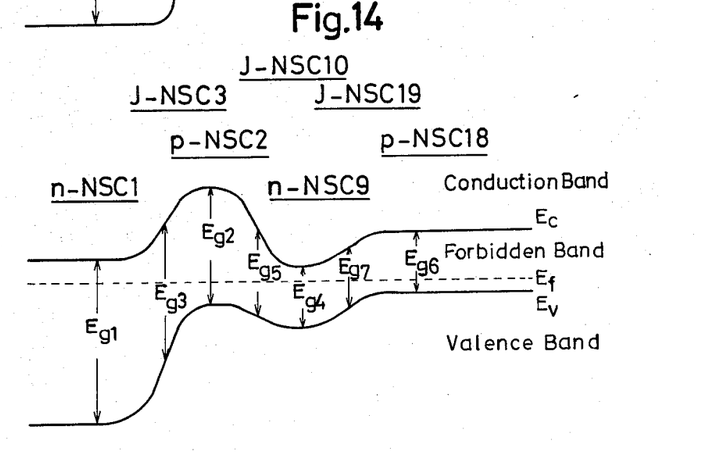

FIG. 14 illustrates another example of the n-p-n-p type photo cell of this invention, which has three p-n hetero junctions as is the case with the example of FIG. 13 and in which parts corresponding to those in FIG. 13 are identified by the same reference characters and are not descrived in detail. This example is identical in construction with the example of FIG. 13 except in that the semiconductor regions J-NSC3, the J-NSC10 and J-NSC9 are wider than those in the latter, and achieves the same advantage as is obtainable with the example of FIG. 13.

FIG. 15 shows an example of a p-i-i-n type photo cell which has one p-i hetero junction, one i-i hetero junction and one n-i hetero junction, and which comprises a p-type non-single-crystal semiconductor region p-NSC4 having an energy gap $E_{g1}$, an i-type non-single-crystal semiconductor region i-NSC13 having an energy gap $E_{g2}$ smaller than that $E_{g1}$, an i-type non-single-crystal semiconductor region i-NSC20 having an energy gap $E_{g4}$ smaller than that $E_{g2}$, an n-type non-single-crystal semiconductor region n-NSC21 having an energy gap $E_{g6}$ smaller than that $E_{g4}$ and non-single-crystal semiconductor regions J-NSC16, J-NSC22 and J-NSC23 which are respectively defined between the semiconductor regions p-NSC4 and i-NSC13, between i-NSC13 and i-NSC20 and between i-NSC20 and n-NSC21. The semiconductor region J-NSC16 functions as a p-i hetero junction and has an energy gap $E_{g3}$ which successively changes from the energy gap $E_{g1}$ on the side of the semiconductor region p-NSC4 to the energy gap $E_{g2}$ on the side of the semiconductor region i-NSC13. The semiconductor region J-NSC22 acts as a n i-i hetero junction and has an energy gap $E_{g5}$ which successively changes from the energy gap $E_{g2}$ on the side of the semiconductor region i-NSC13 to the energy gap $E_{g4}$ on the side of the semiconductor region i-NSC20. The semiconductor region J-NSC23 serves as an n-i hetero junction and has an energy gap $E_{g7}$ which successively changes from the energy gap $E_{g4}$ on the side of the semiconductor region i-NSC20 to the energy gap $E_{g6}$ on the side of the semiconductor region n-NSC21.

With such a structure as shown in FIG. 15, it is possible to obtain, with high efficiency, the function of the photo cell which performs the same operation as is achieved by the example of FIG. 12, although no detailed description will be made.

The foregoing is merely illustrative of some examples of this invention, but it will be appreciated that a desired hetero junction semiconductor device can be obtained by a desired sequential arrangement of p-type and n-type non-single-crystal semiconductor regions, a desired sequential arrangement of p-type or n-type and i-type non-single-crystal semiconductor regions, or a desired sequential arrangement of p-type, n-type and i-type non-single-crystal semiconductor regions.

In the present invention, the region forming each hetero junction and the regions on the both sides thereof may also be formed of a material selected from a group consisting of silicon, germanium, silicon carbides, germanium carbides, silicon nitrides, germanium nitrides, silicon oxides and germanium oxides, other than the materials referred to in the foregoing examples.

Although the present invention has been described as being applied to photo diodes and photo cells, it will be understood that the invention is also applicable to various other hetero junction semiconductor devices.

It will be apparent that many modifications and variations may be effected without departing from the scope of the novel concepts of this invention.

What is claimed is:

1. A hetero junction semiconductor device having at least one inter-semiconductor hetero junction, which comprises at least a first non-single-crystal semiconductor region having a first energy gap, a second non-single-crystal semiconductor region having a second energy gap different from the first energy gap, and a third non-single-crystal semiconductor region defined between the first and second semiconductor regions to serve as a hetero junction, and wherein the third semiconductor region has an energy gap which successively changes from the first energy gap on the side of the first semiconductor region to the second energy gap on the side of the second semiconductor region, and wherein the first, second and third semiconductor regions have doped therein a recombination center neutralizer.

2. A hetero junction semiconductor device according to claim 1, wherein the first semiconductor region has any one of p-type, n-type and i-type conductivity types, and the second semiconductor region has a conductivity type different from that of the first semiconductor region.

3. A hetero junction semiconductor device accoring to claim 1, wherein the recombination center neutralizer is one or more of hydrogen, deuterium, chlorine, fluorine, bromine and halogenide.

4. A hetero junction semiconductor device according to claim 1, wherein each of the first, second and third semiconductor regions is formed of a material selected from a group consisting of silicon, germanium, silicon carbides, germanium carbides, silicon nitrides, germanium nitrides, silicon oxides and germanium oxides.

5. A hetero junction semiconductor device according to claim 1, wherein the first semiconductor region is formed of $Si_xC_{1-x}$ (where $0.5<x<1$), wherein the second semiconductor region is formed of Si, and wherein the third semiconductor region is formed of $Si_yC_{1-y}$ (where the value of y is larger than the value of x and changes from the value of x on the side of the first semiconductor region to 1 on the side of the second semiconductor region).

6. A hetero junction semiconductor device according to claim 1, wherein the first semiconductor region is formed of $Si_3N_{4-x}$ (where $0<x<4$), wherein the second semiconductor region is formed of Si, and wherein the third semiconductor region is formed of $Si_3N_{4-y}$ (where the value of y is larger than the value of x and changes from the value of x on the side of the first semiconductor region to 1 on the side of the second semiconductor region).

7. A hetero junction semiconductor device according to claim 1, wherein the first semiconductor region is formed of $SiO_{2-x}$ (where $0<x<2$), wherein the second semiconductor region is formed of Si, and wherein the third semiconductor region is formed of $SiO_{2-y}$ (where the value of y is larger than the value of x and changes from the value of x on the side of the first semiconductor region to 1 on the side of the second semiconductor region.

* * * * *